(12) United States Patent
Cho et al.

(10) Patent No.: US 6,319,765 B1
(45) Date of Patent: Nov. 20, 2001

(54) METHOD FOR FABRICATING A MEMORY DEVICE WITH A HIGH DIELECTRIC CAPACITOR

(75) Inventors: Ho Jin Cho; Kwon Hong, both of Kyoungki-do (KR)

(73) Assignee: Hyundai Electronics Industries Co., Ltd., Kyoungki-do (KR)

( * ) Notice: Subject to any disclaimer, the term of this patent is extended or adjusted under 35 U.S.C. 154(b) by 0 days.

(21) Appl. No.: 09/473,107

(22) Filed: Dec. 28, 1999

(30) Foreign Application Priority Data

Dec. 30, 1998 (KR) .................................................. 98-61853

(51) Int. Cl.$^7$ .............................................. H01L 21/8242
(52) U.S. Cl. ............................. 438/240; 438/3; 438/239; 438/253; 438/396; 438/686
(58) Field of Search ................................ 438/3, 240, 238, 438/239, 250, 253, 393, 396, 686; 257/310

(56) References Cited

U.S. PATENT DOCUMENTS

| | | | |
|---|---|---|---|
| 5,374,578 | * 12/1994 | Patel et al. ................................ | 438/3 |
| 5,489,548 | 2/1996 | Nishioka et al. ...................... | 438/396 |
| 5,554,564 | 9/1996 | Nishioka et al. ...................... | 438/396 |
| 5,554,866 | 9/1996 | Nishioka et al. ...................... | 257/295 |
| 5,573,979 | 11/1996 | Tsu et al. .............................. | 438/396 |
| 5,605,858 | 2/1997 | Nishioka et al. ...................... | 505/330 |
| 5,635,741 | 6/1997 | Tsu et al. .............................. | 257/310 |
| 5,656,852 | 8/1997 | Nishioka et al. ...................... | 257/632 |
| 5,731,220 | 3/1998 | Tsu et al. .............................. | 438/782 |
| 5,786,259 | * 7/1998 | Kang ..................................... | 438/396 |
| 5,811,851 | 9/1998 | Nishioka et al. ...................... | 257/310 |
| 5,874,364 | * 2/1999 | Nakabayashi et al. .............. | 438/738 |

FOREIGN PATENT DOCUMENTS

| | | |
|---|---|---|
| 8111509 | 4/1996 | (JP) . |
| 982909 | 3/1997 | (JP) . |
| 9232504 | 9/1997 | (JP) . |
| 9232532 | 9/1997 | (JP) . |
| 1079470 | 3/1998 | (JP) . |
| 1079471 | 3/1998 | (JP) . |
| 10144884 | 5/1998 | (JP) . |
| 10163447 | 6/1998 | (JP) . |
| 10200069 | 7/1998 | (JP) . |
| 10335581 | 12/1998 | (JP) . |

* cited by examiner

Primary Examiner—Carl Whitehead, Jr.
Assistant Examiner—Toniae M. Thomas
(74) Attorney, Agent, or Firm—Selitto, Behr & Kim

(57) ABSTRACT

The present invention provides a method for fabricating a ferroelectric memory device to reduce manufacturing cost and to obtain the electric characteristic of capacitor.

The method comprises the steps of: forming an intermetal insulating layer provided with a contact hole exposing a junction region formed on a semiconductor layer having the junction region; forming a contact plug within the contact hole; forming a barrier layer and a metal layer for lower electrode on the intermetal insulating layer successively; forming a lower electrode by patterning selected portions of the metal layer for lower electrode and the barrier layer; forming a high dielectric layer on the substrate on which the lower electrode is formed; and forming an upper electrode on the high dielectric layer, wherein during forming the upper electrode, an F ion layer to be trapped by dangling bonds formed at an interface between the upper electrode and the high dielectric layer, is formed at the interface.

20 Claims, 5 Drawing Sheets

METHOD FOR FABRICATING A MEMORY DEVICE WITH A HIGH DIELECTRIC CAPACITOR

FIELD OF THE INVENTION

This invention relates to a method for fabricating a semiconductor memory device, and more particularly to a method for fabricating a semiconductor memory device using a high dielectric material as a capacitor insulating layer.

BACKGROUND OF THE INVENTION

As the integrity of semiconductor memory device is increased, cell dimension and distance between cells are decreased. In the meantime, it is required a capacitor to have great capacitance, since the capacitor should maintain certain degree of capacitance.

In this regard, to optimize the capacitance of a capacitor, a high dielectric layer such as a (barium/strontium)titanium oxide {$(Ba,Sr)TiO_3$;BST} layer having high dielectric constant has been used as a capacitor insulating layer. When such high dielectric layer is applied to for the capacitor insulating layer, a metal layer of Platinum(Pt) is used as an electrode for the capacitor.

FIG. 1 is a cross-sectional view showing a method for fabricating a semiconductor memory device having a high dielectric layer as a capacitor insulating layer.

Referring to FIG. 1, an intermetal insulating layer 11 is formed on a semiconductor substrate 10 provided with a junction region 10a. Then, the intermetal insulating layer 11 is etched to expose thereby forming a contact hole H. A contact plug 12 is formed of an impurity-doped polysilicon layer within the contact hole H according to a known method. A barrier metal layer 13 comprised of a titanium 13a and a titanium nitride 13b, is deposited on the contact plug 12 and the intermetal insulating layer 11. A Pt metal layer for lower electrode is deposited on the intermetal insulating layer 11 in which the barrier layer 13 is formed. The Pt metal layer for lower electrode and the barrier layer 13 are patterned to be remained on and around the contact plug 12 thereby forming a lower electrode 14. A high dielectric layer 15, for example a BST layer is formed on the intermetal insulating layer 11 in which the lower electrode 14 is formed. A Pt metal layer for upper electrode is formed on the high dielectric layer 15, and then is patterned thereby forming an upper electrode 16. At this time, by taking into consideration that the Pt metal layer for upper electrode has fine cell dimension and distance, the Pt layer for upper electrode is formed according to the chemical vapor deposition(CVD) method incurring excellent step coverage. When the Pt layer is deposited according to the CVD method, a Pt precursor is required. As for such precursor, organic metal materials such as $Pt(C_5H_7O_2)_2$, $(C_5H_5)Pt(CH_3)_3$, $(CH_3C_5H_4)Pt(CH_3)_3$ and $Pt(C_5HF_6O_2)_2$ can be used. However, when $Pt(C_5H_7O_2)_2$ is deposited, high temperature of over 500° C. is required and the depositing rate is very slow. Furthermore, since the stability of $(C_5H_5)Pt(CH_3)_3$ and $(CH_3C_5H_4)Pt(CH_3)_3$ is very low, they are applied to real production rarely. On the other hand, $Pt(C_5HF_6O_2)_2$ is deposited at temperature below 500° C. and has excellent thermal stability. Especially, since the precursor of $Pt(C_5HF_6O_2)_2$ includes F atom or element, the F atom is trapped on a dangling bond of an interface between the high dielectric layer and the Pt layer for upper electrode during depositing Pt layer for upper electrode. Thus, leakage current is decreased by the elimination of trap sites.

This results can be proved by following graphs.

First, FIG. 2 is a graph showing voltage vs. dielectric constant of the high dielectric layer. The curve (A) in FIG. 2 is a result when the $Pt(C_5HF_6O_2)_2$ is used as a precursor and a top Pt layer is formed according to the CVD method. The curve (B) is a result when the $MeCpPt(Me)_3$ is used as a precursor and a top Pt layer is formed according to the CVD method. And, the curve (C) is a result when the top Pt layer is deposited according to the physical vapor deposition (PVD) method. According to FIG. 2, the curve (A) has relatively higher dielectric constant than the curves (B) and (C) at the same voltage. This is because the $Pt(C_5HF_6O_2)_2$ is used as a precursor. Then, trap sites reduce at the interface between the high dielectric layer 15 and the upper electrode 16 thereby lowering leakage current. By the stable interface characteristics, the thickness of interfacial layer is reduced thereby improving dielectric characteristic of the high dielectric layer 15.

FIG. 3 is a graph showing the Auger-Electron Spectroscopy(AES) when the Pt layer is used as the $Pt(C_5HF_6O_2)_2$ precursor. Referring to FIG. 3, there are a multitude % of F at the interface between the top Pt layer for upper electrode and the high dielectric layer. That means, the F bond is trapped on a dangling bond existing on the interface between the Pt layer for upper electrode and the high dielectric layer, thereby obtaining more stabilized leakage current characteristic.

As described, when the upper electrode of the ferroelectric capacitor is formed according to the CVD method using $Pt(C_5HF_6O_2)_2$ precursor, electric characteristic of the capacitor is improved. However, $Pt(C_5HF_6O_2)_2$ precursor is expensive material ($300/1 g) that is too expensive to apply mass-production. While $Me(CpPt(Me)_3(Pt-10)$ is cheaper than $Pt(C_5HF_6O_2)_2$ precursor, however electric characteristic of capacitor, e.g. dielectric property of dielectric layer and leakage current characteristic, is inferior to $Pt(C_5HF_6O_2)_2$.

SUMMARY OF THE INVENTION

Accordingly, the present invention is directed to reduce manufacturing cost and to obtain the improved electrical characteristics of capacitor.

To accomplish foregoing object, a method for fabricating a memory device with a high dielectric capacitor comprises the steps of: forming an intermetal insulating layer provided with a contact hole exposing a junction region formed on a semiconductor layer having the junction region; forming a contact plug within the contact hole; forming a barrier layer and a metal layer for lower electrode on the intermetal insulating layer successively; forming a lower electrode by patterning selected portions of the metal layer for lower electrode and the barrier layer; forming a high dielectric layer on the substrate on which the lower electrode is formed; and forming an upper electrode on the high dielectric layer, wherein during forming the upper electrode, an F atom to be trapped by dangling bonds formed at an interface between the upper electrode and the high dielectric layer, is formed at the interface.

Further, the present invention provides a method for fabricating a memory device with a high dielectric capacitor comprising the steps of: forming an intermetal insulating layer provided with a contact hole exposing a junction region formed on a semiconductor layer having the junction region; forming a contact plug within the contact hole; forming a barrier layer and a metal layer for lower electrode on the intermetal insulating layer successively; forming a lower electrode by patterning selected portions of the metal layer for lower electrode and the barrier layer; forming a high dielectric layer on the substrate in which the lower electrode is formed; forming a first Pt layer on the high dielectric layer according to the MOCVD method by providing F-containing vapor or gas; forming a second Pt layer on the first Pt layer; and forming an upper electrode on the high dielectric layer by patterning selected portions of the first and the second Pt layers and the high dielectric layer, wherein the first Pt layer is formed by using a precursor selected from a group consisting of Pt-acetylacetate, CpPt(Me)$_3$ and MeCpPt(Me)$_3$.

DETAILED DESCRIPTION OF THE PREFERRED EMBODIMENTS

Hereinafter, a preferred embodiment of the present invention will now be described with reference to accompanying drawings.

Figure 1:
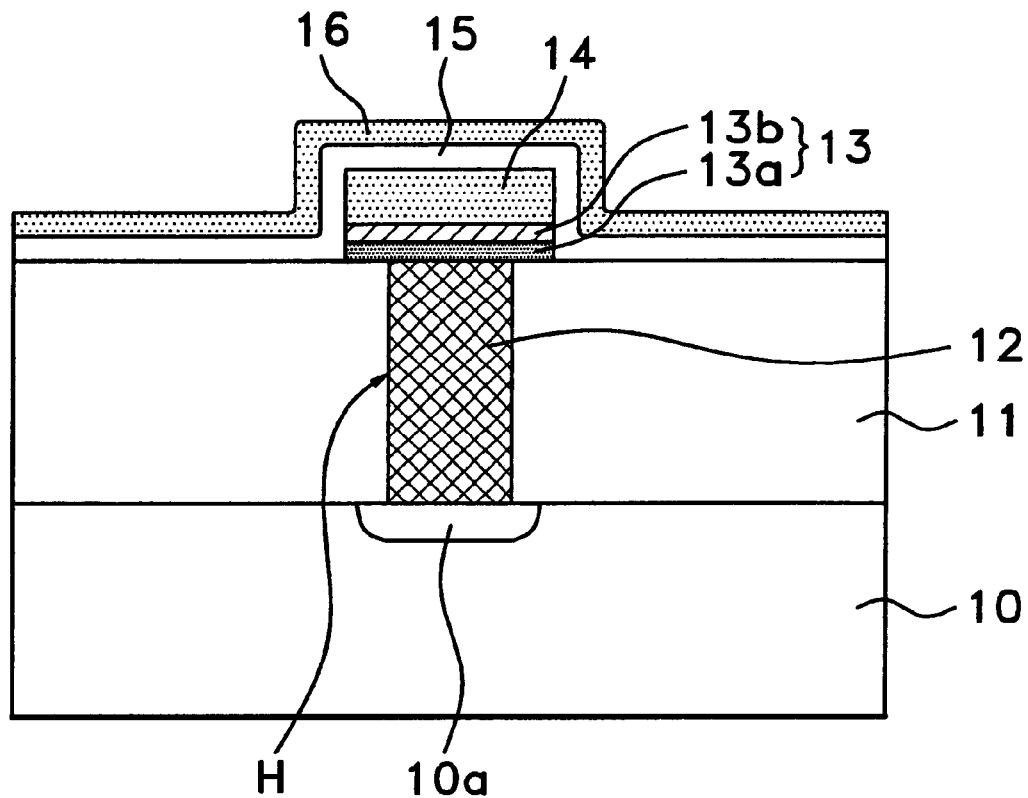
FIG. 1 is a cross-sectional view illustrating a method for fabricating a memory device with a high dielectric capacitors.
Figure 2:
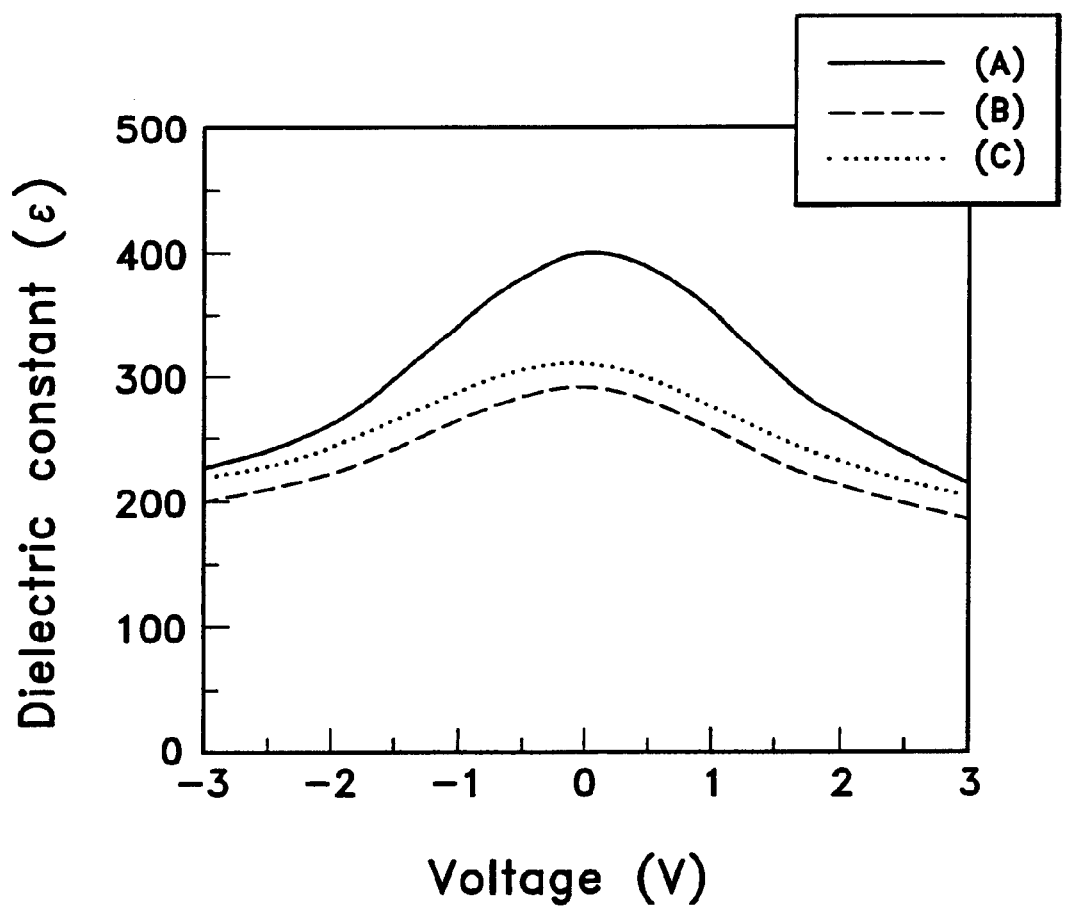
FIG. 2 is a graph showing voltage vs. dielectric constant of the high dielectric layer according to a Pt depositing method.
Figure 3:
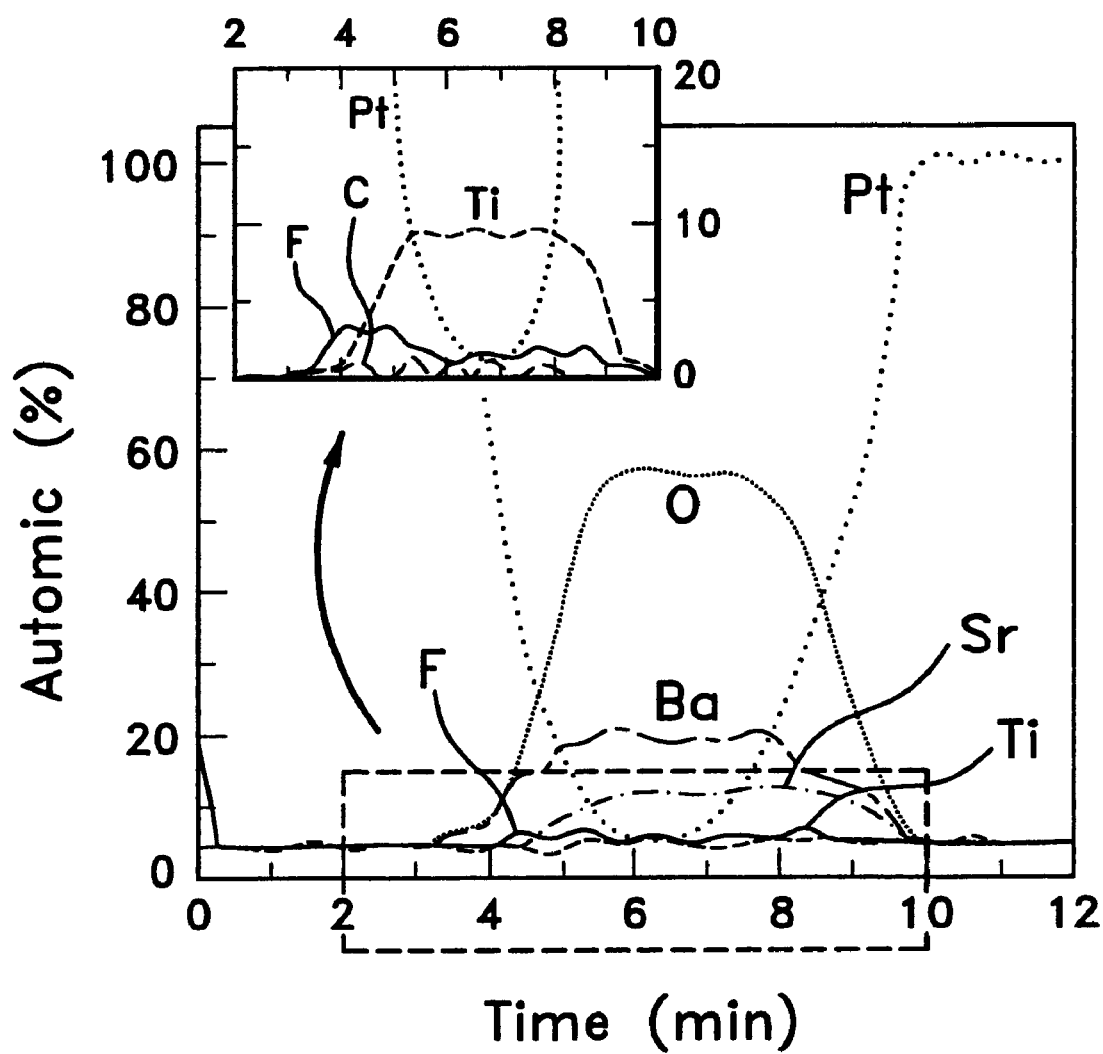
FIG. 3 is a graph showing an AES result when a Pt layer for upper electrode is formed of Pt(C$_5$HF$_6$O$_2$)$_2$.
Figure 4A:
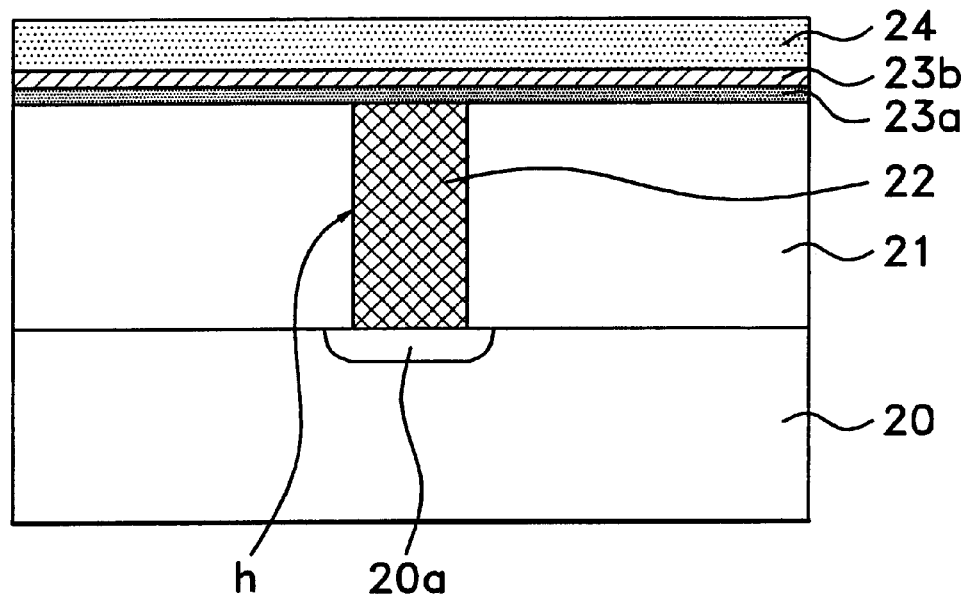
FIGS. 4A to 4D are cross-sectional views showing a method for fabricating a memory device with a high dielectric capacitor according to the present invention.

Referring to FIG. 4A, an intermetal insulating layer 21 is formed on a semiconductor substrate 20 provided with a junction region 20a. A selected portion of the intermetal insulating layer 21 is etched to expose the junction region 20a thereby forming a contact hole h for capacitor. According to the CVD method, a polysilicon layer is deposited on the intermetal insulating layer 21 by thickness of 500~3000 Å such that the polysilicon layer is buried in the contact hole h. The polysilicon layer is removed according to the chemical mechanical polishing(CMP) method until the intermetal insulating layer 21 is exposed, thereby forming a contact plug 22. A first barrier layer 23a and a second barrier layer 23b are successively deposited on the intermetal insulating layer 21. The first barrier layer 23a is formed of selectively Ti layer or Ta layer with thickness of 100~1000 Å. The second barrier layer 23b is formed of selectively TiN layer with thickness of approximately 200~1000 Å. Furthermore, instead of the second barrier layers 23b, a layer selected from a group consisting of TiSiN layer, TaSiN layer and TaAlN layer can be used as a barrier layer. A metal layer 24 for lower electrode is deposited on the second barrier layer 23b. The metal layer 24 for lower layer is formed of a layer selected from a group consisting of Pt, Ir, Ru, IrO$_2$ and RuO$_2$, or preferably a Pt layer and is formed with thickness of 0.2~1.5 μm according to the CVD or the PVD method.

Figure 4B:
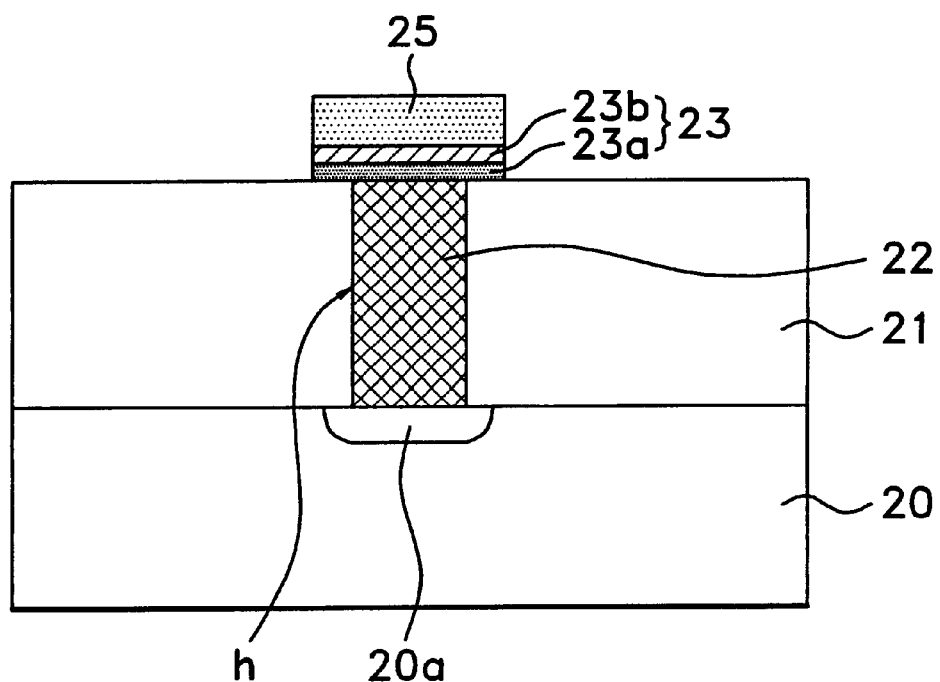

As shown in FIG. 4B, a resist pattern(not shown) for forming lower electrode is formed on the metal layer 24 for lower electrode according to a known photolithography process. Next, by using the photoresist pattern, the metal layer 24 for lower electrode, the second barrier layer 23a and the first barrier layer 23b are etched thereby forming a lower electrode 25. The resist pattern is removed by a known method.

Figure 4C:
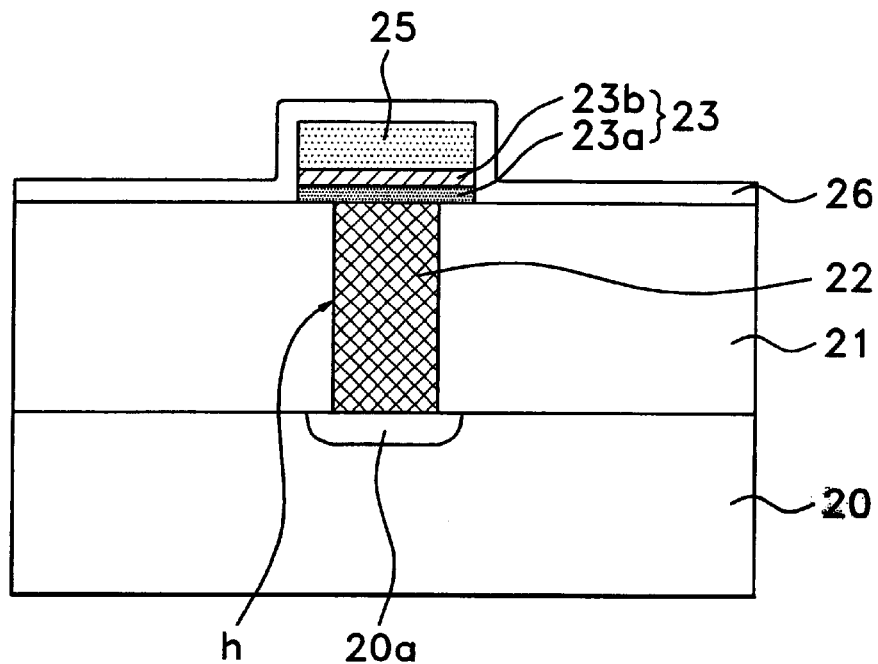

Afterward, as shown in FIG. 4C, a high dielectric layer 26, for example an BST layer is formed on the intermetal insulating layer in which the lower electrode 25 is formed. The high dielectric layer 26 is formed with thickness of 100~500 Å at temperature of 400~600° C. according to the metal organic chemical vapor deposition (MOCVD) method.

Figure 4D:
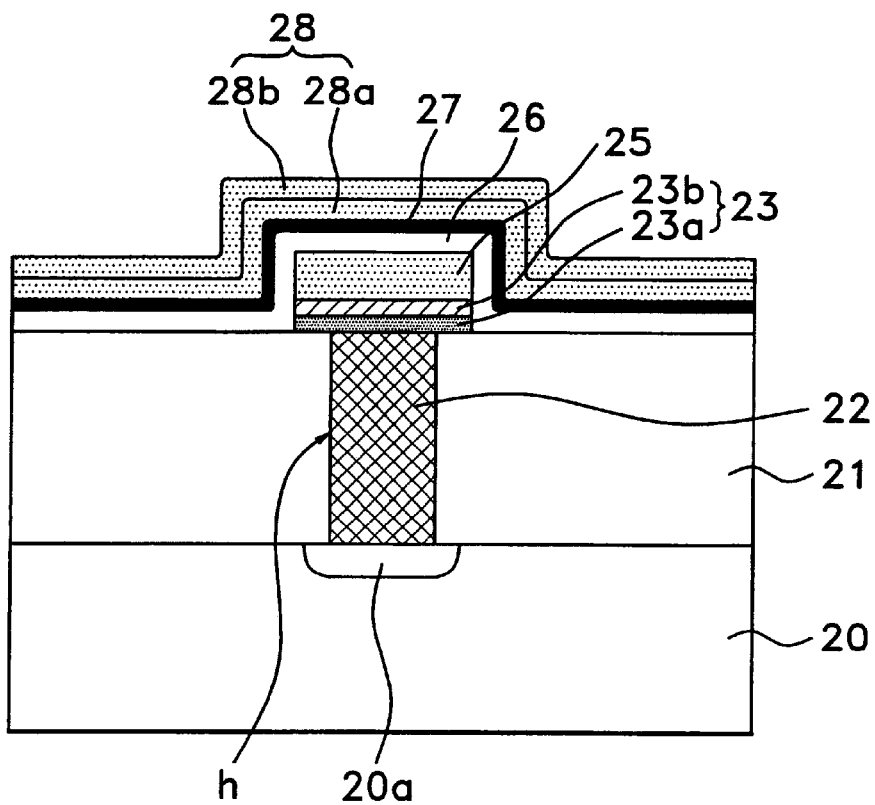

Referring to FIG. 4D, a first Pt layer 28a for upper electrode is formed on the high dielectric layer 26. Herein, the first Pt layer 28a for upper electrode is formed under hydrogen or oxygen atmosphere with thickness of approximately 50~200 Å according to the CVD method, more preferably MOCVD having excellent step coverage property. At this time, a cheaper precursor selected from a group consisting of Pt-acetylacetate, CpPt(Me)$_3$ and MeCpPt(Me)$_3$, can be used as a precursor for the first Pt layer 28a. During depositing the first Pt layer 28a, an F-containing vapor, for example hexafluoro-acetylacetate (HFA) vapor or F-containing gas is provided so as to combine dangling bonds between the first Pt layer 28a for upper electrode and the high dielectric layer 26. Then, an F atom layer 27 is trapped at the interface between the first Pt layer 28a for upper electrode and the high dielectric layer 26. At this time, the F atoms in the F atom layer 27 is combined with the dangling bonds of the interface between the first Pt layer 28a and the high dielectric layer 26 thereby improving dielectric characteristic of the device. Herein, a gas selected from a group consisting of SF$_6$, CF$_4$, CHF$_3$, CH$_3$F and NF$_3$ can be used for the F-containing gas. And then, the high dielectric layer 26 is treated by N$_2$O/O$_2$ plasma or UV-O$_3$ to prevent an oxygen deficiency, when the first Pt layer 28a is formed under hydrogen atmosphere. A second Pt layer 28b for upper electrode is formed on the first Pt layer 28a with thickness of 200~500 Å according to the MOCVD method. At this time, similar to the first Pt layer 28a, the second Pt layer 28b uses as a precursor a material selected from a group consisting of Pt-acetylacetate, CpPt(Me)$_3$ and MeCpPt(Me)$_3$. During depositing the second Pt layer 28b, F gas is not injected. Next, selected portions of the second Pt layer 28b, the first Pt layer 28a and the high dielectric layer 26 are patterned thereby accomplishing a ferroelectric capacitor comprising the upper electrode 28, the high dielectric layer 26 and the lower electrode 25.

Afterward, the capacitor is processed by a rapid thermal process (RTP) or a furnace annealing so as to crystallize the upper electrode 28, the high dielectric layer 26 and the lower electrode 25.

As described above, according to the present invention, the Pt layer for upper electrode is deposited according to the MOCVD method with providing the HFA steam or the F-containing gas. Thus, it is relatively easy to produce the F ion layer at the interface between the upper electrode and the high dielectric layer by using cheaper Pt precursor rather than requiring expensive precursor such as Pt(CHF$_6$O$_2$)$_2$. At this time, F atoms in the F atom layer are trapped by dangling bonds existing at the interface between the Pt layer for upper electrode and the high dielectric layer, thereby lowering leakage current originated from the dangling bonds and decreasing the interfacial layer thickness with lower dielectric constant. Therefore, the electrical characteristic of high dielectric capacitor is improved.

While the present invention has been described with reference to certain preferred embodiment, various other modifications will be apparent to and can be readily made by those skilled in the art without departing from the scope and spirit of the present invention.

What is claimed is:

1. A method for fabricating a memory device with a high dielectric capacitor comprising the steps of:

forming an intermetal insulating layer provided with a contact hole exposing a junction region formed on a semiconductor layer having the junction region;

forming a contact plug within the contact hole;

forming a barrier layer and a metal layer for lower electrode on the intermetal insulating layer successively;

forming a lower electrode by patterning selected portions of the metal layer for lower electrode and the barrier layer;

forming a high dielectric layer on a substrate on which the lower electrode is formed; and forming an upper electrode on the high dielectric layer, wherein the step of forming the upper electrode includes the steps of forming a first Pt layer on the high dielectric layer according to a metal-organic chemical vapor deposition (MOCVD) method by providing an F-containing vapor or gas; and forming a second Pt layer on the first Pt layer, and wherein during the formation of the upper electrode, F atoms are included at an interface between the upper electrode and the high dielectric layer.

2. The method of claim 1, wherein the first Pt layer is formed by using a precursor selected from a group consisting of Pt-acetylacetate, $CpPt(Me)_3$ and $MeCpPt(Me)_3$.

3. The method of claim 1, wherein the first Pt layer is formed with thickness of 50~200 Å.

4. The method of claim 1, wherein the F-containing vapor or gas is a HFA steam.

5. The method of claim 1, wherein the F-containing gas is selected from a group consisting of $SF_6$, $CF_4$, $CHF_3$, $CH_3F$ and $NF_3$.

6. The method of claim 1, wherein the first Pt layer is deposited under a hydrogen atmosphere.

7. The method of claim 1, wherein the second Pt layer is formed according to the MOCVD method.

8. The method of claim 7, wherein the second Pt layer is formed with thickness of 50~200 Å.

9. The method of claim 1, further comprising the step of treating the high dielectric layer with a $N_2O/O_2$ plasma or $UV-O_3$ after forming the second Pt layer.

10. The method of claim 1, wherein the high dielectric layer is formed of a BST layer.

11. The method of claim 10, wherein the BST layer is formed according to the MOCVD method at temperature of 400~600° C. with thickness of 100~500 Å.

12. The method of claim 1, further comprising the step of annealing a resultant on the substrate with the use of an RTP process or a furnace, after the step of forming the upper electrode.

13. The method of claim 1, wherein the lower electrode is formed of a material selected from a group consisting of Pt, Ir, Ru, $IrO_2$ and $RuO_2$.

14. The method of claim 1, wherein the lower electrode is formed according to a CVD or PVD method.

15. The method of claim 1, wherein the barrier layer is formed by depositing a titanium layer and a titanium nitride layer.

16. The method of claim 15, wherein the titanium layer is formed with thickness of 100~1000 Å and the titanium nitride layer is formed with thickness of 200~1000 Å.

17. The method of claim 1, wherein the barrier layer is made of a layer selected from a group consisting of a TiSiN layer, TiAlN layer, TaSiN layer and TaAlN layer.

18. A method for fabricating a memory device with a dielectric capacitor comprising the steps of:

forming an intermetal insulating layer provided with a contact hole exposing a junction region formed on a semiconductor layer having the junction region;

forming a contact plug within the contact hole;

forming a barrier layer and a metal layer for lower electrode on the intermetal insulating layer successively;

forming a lower electrode by patterning selected portions of the metal layer for lower electrode and the barrier layer;

forming a high dielectric layer on a substrate on which the lower electrode is formed;

forming a first Pt layer on the high dielectric layer according to a metal-organic chemical vapor deposition method by providing an F-containing steam or gas;

forming a second Pt layer on the first Pt layer; and forming an upper electrode on the high dielectric layer by patterning selected portions of the first and the second Pt layers and the high dielectric layer, wherein the first Pt layer is formed by using a precursor selected from a group consisting of Pt-acetylacetate, $CpPt(Me)_3$ and $MeCpPt(Me)_3$.

19. The method of claim 18, wherein the F-containing steam is a HFA steam.

20. The method of claim 18, wherein the F-containing gas is selected from a group consisting of $SF_6$, $CF_4$, $CHF_3$, $CH_3F$ and $NF_3$.

* * * * *